United States Patent
Gunturi et al.

(10) Patent No.: US 8,345,811 B2
(45) Date of Patent: Jan. 1, 2013

(54) DIGITAL RADIO PROCESSOR ARCHITECTURE WITH REDUCED DCO MODULATION RANGE REQUIREMENT

(75) Inventors: Sarma S. Gunturi, Bangalore (IN); Jawaharlal Tangudu, Bangalore (IN); Sthanunathan Ramakrishnan, Bangalore (IN); Jayawardan Janardhanan, Bangalore (IN); Debapriya Sahu, Bangalore (IN); Subhashish Mukherjee, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 1125 days.

(21) Appl. No.: 12/060,886

(22) Filed: Apr. 2, 2008

(65) Prior Publication Data
US 2009/0252269 A1 Oct. 8, 2009

(51) Int. Cl.
*H04L 7/00* (2006.01)
(52) U.S. Cl. ........ 375/365; 375/357; 375/358; 375/362; 375/363; 375/364; 375/366; 375/371; 375/373; 375/374; 375/375; 375/376
(58) Field of Classification Search ................... 375/365, 375/357, 358, 362, 363, 364, 366, 371, 373, 375/374, 375, 376; 331/2, 16, 182; 342/20
See application file for complete search history.

(56) References Cited

U.S. PATENT DOCUMENTS

| 5,852,630 | A  | * | 12/1998 | Langberg et al. | 375/219 |
| 7,605,665 | B2 | * | 10/2009 | Chambers et al. | 331/16 |
| 2006/0033582 | A1 | * | 2/2006 | Staszewski et al. | 331/16 |
| 2007/0110184 | A1 | * | 5/2007 | Liang et al. | 375/302 |

OTHER PUBLICATIONS

R.B.Staszewski and C.-M.Hung and N.Barton and M.-C.Lee and D.Leipold, "A Digitally Controlled Oscillator in a 90 nm Digital CMOS process for Mobile Phones," IEEE Journal of Solid State Circuits, pp. 2203-2211, Nov. 2005.

* cited by examiner

*Primary Examiner* — Dhaval Patel
(74) *Attorney, Agent, or Firm* — Ronald O. Neerings; Wade James Brady, III; Frederick J. Telecky, Jr.

(57) ABSTRACT

A method of achieving reduced modulation range requirement in a Digitally Controlled Oscillator (DCO) which is deployed as part of a DRP (Digital Radio Processor) and tuned to a tuning frequency range having operating-channel center-frequencies, wherein phase difference between consecutive samples is termed as FCW (Frequency Control Word), uses the steps of digitally modifying and limiting the FCW so that the FCW does not exceed known FCW thresholds, e.g., chosen from $\pi/2$, $\pi/4$, $\pi/8$, and redistributing the FCWs while maintaining a cumulative sum of phases and without significant EVM (Error Vector Magnitude) degradation. The FCW threshold can be chosen arbitrarily and need not be in the form of $\pi/2^n$. The method uses a FCW limiting algorithm which reduces supply voltage sensitivity of the DCO and enables significant reduction in area of capacitor bank which would be otherwise needed.

22 Claims, 4 Drawing Sheets

DIGITAL RADIO PROCESSOR ARCHITECTURE WITH REDUCED DCO MODULATION RANGE REQUIREMENT

FIELD OF THE INVENTION

This invention generally relates to DRP (Digital Radio Processor) architecture and more particularly to a system and method for reducing DCO (Digitally Controlled Oscillator) modulation range requirement.

BACKGROUND OF THE INVENTION

The explosive growth of cellular phone industry and the ever increasing and continual integration of Bluetooth, Global Positioning System (GPS) and Wireless LAN (WLAN) with cellular phones demand a low cost as well as area-efficient design for the various components. While the known continual scaling down of CMOS transistor with process node migration can significantly reduce the area of the digital content of these systems, it is noted however that the analog portion, primarily in the radio, does not lend itself to scaling down as much. An all-digital PLL (ADPLL-All Digital Phase Locked Loop) referred to recently in the IEEE journal of Solid State Circuits (vide: R. B. Staszewski and C.-M. Hung and N. Barton and M.-C. Lee and D. Leipold, "A Digitally Controlled Oscillator in a 90 nm Digital CMOS process for Mobile Phones, *IEEE Journal of Solid State Circuits*, pp. 2203-2211, November 2005) enables replacement of the conventional analog PLL in the radios. This in turn facilitates the design of a radio with a significantly more digital logic than earlier possible and hence can scale down with process node. Such digital architecture for radio design is referred to herein as Digital Radio Processor (DRP).

The ADPLL is at the core of DRP design and implements the PLL completely in digital domain. The idea in DRP is to use the accuracy of timing in edge transitions of digital signals rather than the voltage levels of the analog signals. Hence, analogous to voltage controlled oscillator (VCO), a digitally controlled oscillator (DCO) is used in ADPLL.

A polar architecture is used in a DRP to reuse the ADPLL for modulation, thereby reducing area. The DRP includes a Cordic block which converts I, Q samples from baseband to r, θ samples. For purposes of this invention, the phase difference between consecutive samples is termed the frequency control word (FCW). It is noted that the consecutive samples in embodiments are reckoned at the Cordic output. In the transmitter, RF modulation is performed in the digital domain by feeding FCW into the ADPLL. This in turn requires the DCO to provide the frequency range for modulation known as the modulation range of the DCO. The DCO also needs to tune to operating channel center frequencies of the system, and herein, the frequency range required to support this tuning is known as the tuning range of the DCO.

For the Cordic block, the Cordic rate (say, fs) increases significantly as the bandwidth of the modulation range and its EVM (Error Vector Magnitude) requirement increase. It is noted that large phase changes occur as the r, θ trajectory crosses the origin. For example, a phase change of ±π occurring near the origin causes the FCW range to be ±fs/2 which is the same as the Cordic rate, namely fs. This implies the modulation range of the DCO to be the same as the Cordic rate, which for example is 300 MHz for WLAN applications.

It is further noted that the DCO also needs to provide I and Q phases for the receiver, which is accomplished by operating the DCO at twice the carrier frequency. For example, at the receiver, to support WLAN in 4.8-5.9 GHz band, the tuning range of the DCO should be 9.6-11.8 GHz. It is also noted that the ISM band of 2.4 GHz band can also be catered to with the same DCO by dividing the frequency by 4. For example, for the transmitter to support a modulation range of 300 MHz (Cordic rate) in 2.4 GHz band, the DCO modulation range should be 1.2 GHz at 11.8 GHz. One disadvantage with the above provision is that the higher modulation range increases parasitic capacitance and makes it difficult to provide the large tuning range. The other disadvantage is that the number of capacitors needs to be increased in order to provide the higher modulation range, and these capacitors are very sensitive to the supply voltage variations. Consequently the system becomes sensitive to high transmitting powers and causes severe EVM degradation during transmission.

An exemplary form of transmitter architecture for a DRP is shown in FIG. 1. It is seen that in-phase (I) and quadrature (Q) signals coming from baseband are converted into amplitude (r) and phase (θ) by the Cordic block before being processed in the radio. The advantage of the polar architecture is that the r and θ samples are digitally processed separately before being finally mixed in a Digital Power Amplifier (DPA). In the phase path, the phase difference known as frequency control word (FCW) is used in the processing. In fact, modulation is also performed in digital domain by feeding in FCW directly into the DCO. The DCO can be modeled as an accumulator of frequency to trace the phase trajectory or, alternatively, to cause linear interpolation between two phase instants. Unlike a VCO, the output of DCO is a square wave. The modulation information is captured in the transition edges of the DCO clock. As a result of this, when transmitting, the clock output of DCO is data modulated and is of non-uniform period, and not a constant uniform clock. This digital modulation scheme imposes certain constraints on the DCO and system as described next.

The function of Cordic block as aforesaid is to capture the I and Q signal trajectory in terms of r and θ. This implies that as the signal trajectory passes through origin from 1st quadrant to 3rd quadrant, or 2nd quadrant to 4th quadrant or vice-versa, there can be an instantaneous phase change close to ±π radians. If the sampling frequency of the Cordic is $f_{CORDIC}$ then the instantaneous frequency change is $$\frac{\pm \pi}{2\pi} * f_{CORDIC} = \pm f_{CORDIC}/2.$$

As this FCW is fed directly into the DCO it should be able to support these instantaneous frequency requirements. This frequency range requirement coming due to modulation is called the modulation range of the DCO. From the above discussion it is evident that the modulation range of DCO should be $f_{CORDIC}$.

If the modulation bandwidths are quite small like in GSM, Bluetooth or WCDMA then sampling frequency of Cordic is small and hence a small modulation range is required for DCO. However as the modulation bandwidth goes up the sampling frequency of the Cordic increases considerably. For instance, to support the WLAN signal the sampling frequency of the Cordic and the DCO modulation range should be 300 MHz.

Wireless LAN systems operate in 2.4 GHz(ISM band) as well as 4.8-5.9 GHz (including 802.11j and UNII band). This implies that DCO should be able to tune to any of the center frequencies in the above bands. This center frequency tuning requirement is referred to as DCO tuning range. Also note that though the transmitter in DRP has polar architecture, the receiver has a conventional architecture of in-phase (I) and quadrature (Q) signals. Therefore, at a particular carrier frequency the system needs cosine and sine waveforms. This is accomplished by operating the DCO at twice the carrier frequency for UNII band and four times the carrier frequency in ISM band. These requirements imply that in order to support WLAN, DCO should have tuning range of 9.6-11.8 GHz. The modulation range requirement of 300 MHz at 2.4 GHz translates to 1.2 GHz modulation range at 9.6 GHz.

The modulation and tuning range of a DCO are very critical parameters in its design. As the modulation range of DCO increases, the number of capacitors required in the design also increases thereby increasing the parasitic capacitance. This parasitic capacitance makes it difficult to achieve wide tuning range while providing the large modulation range for the DCO. An added disadvantage is that these capacitors are very sensitive to supply-voltage fluctuations. Therefore, the larger the number of capacitors in the DCO the greater is their supply voltage sensitivity. This makes it extremely difficult to design a DCO with 1.2 GHz modulation range and tuning range from 9.6-11.8 GHz. The tuning range cannot be reduced as it is decided by operating channel frequencies. Consequently the modulation range requirement of the DCO should be reduced to make the DCO design feasible.

Prior Art: Exception Handling:

One prior art method of reducing modulation range is to generate merely 0°, 90°, 180°, etc., phases at the DCO output. Considering that the large phase jumps of 180°, 90° do not occur frequently, the large phase jumps can be treated as exceptions, and the DCO phase changed accordingly. Even though exception handling (which is used for example in DRP for WCDMA) is acceptable and produces about the same EVM as the full modulation DCO, it is noted that the method of exception handling (i) does not trade off the EVM to get reduced out of band noise, and (ii) does not use the information that for large jumps, the amplitude r is small, and gradual deviation from deal trajectory will not affect EVM considerably.

Also, with prior art, phase noise is degraded and the complexity increases when more phases of the DCO clock are needed such as 22 ½°, 45°, etc, when the angle is not $180/2^n$ where n is an integer.

It is noted that in prior art, the exception handling technique has been used to address the sudden phase jumps of $\pm\pi$ or $\pm\pi/2$ radians. Thus the instantaneous large phase jumps were avoided thereby avoiding the high DCO modulation range requirement. As an example, for a phase jump of $\pi$, instead of feeding a FCW of $\pi$, zero was fed into the DCO and its clock was inverted to accommodate the $\pi$ jump. Exception handling works well for single-carrier systems since it maintains the error vector magnitude (EVM) as with a full modulation range DCO. However it has the disadvantage that it significantly raises the out of band noise floor for OFDM systems. It also has high complexity as it is implemented in the analog domain by multiplexing the different phases of DCO clock and hence can also potentially degrade the phase noise performance of the system. Furthermore, the complexity increases as more phases of DCO clock like $\pi/4$, $\pi/8$ etc. are needed or when the angle is not of the form $\pi/2^n$, where n is an integer. For example, one method to generate $\pi/4$ phase is to run the DCO at 8 times the carrier frequency (2.4 GHz) and then use dividers to divide it down to get the various phases. But for carrier frequency of 2.4 GHz it is extremely difficult for the DCO to operate at 19.2 GHz. Furthermore, if the dividers are operating at these high speeds, the consequent power consumption also increases significantly which is very significant for systems which are integrated with cellular phones.

SUMMARY OF THE INVENTION

The invention is directed to a method of reducing DCO modulation range requirement in DRP architectures, by controlling FCW so that no FCW value exceeds a predetermined threshold.

Described herein in the context of reducing the DCO modulation range requirement in a DCO is an algorithm which modifies the FCW profile from the CORDIC to limit the maximum instantaneous frequency going into DCO with very little degradation in the performance of the system. This in turn reduces the modulation range requirement in the DCO without adversely affecting EVM and without complex analog implementations.

In one form the invention resides in a method, in a DRP (Digital Radio Processor) which uses a Cordic block that converts IQ signal samples from baseband to r and $\theta$ samples, and which includes a DCO (Digitally Controlled Oscillator) wherein phase difference between consecutive samples is termed as FCW (Frequency Control Word), the method being configured for digitally modifying and limiting FCW so that no FCW value exceeds a predetermined FCWthreshold.

In another form, the invention resides in a method in a Digitally Controlled Oscillator (DCO) which is deployed as part of a DRP (Digital Radio Processor) and tuned to a tuning frequency range having operating-channel center-frequencies, wherein phase difference between consecutive samples is termed as FCW (Frequency Control Word), the method being configured for digitally modifying and limiting the FCW (Frequency Control Word) so that the FCW does not exceed known thresholds chosen from $\pi/2$, $\pi/4$, $\pi/8$, and redistributing the FCWs while maintaining a cumulative sum of phases.

In one form of the invention, a) the phase trajectory is traversed as a cumulative sum of the FCWs, recognizing that large phase changes occur near origin (amplitude is small) where gradual deviation from the ideal theta trajectory can only slightly degrade the EVM and significantly reduce out of band noise.

In the present method:

b) a slight redistribution of the FCWs is made while maintaining the cumulative sum of FCWs, whereby EVM is not considerably affected;

c) the phase changes (FCW) are limited to a specified threshold such as $\pi/2$, $\pi/4$ and so forth, to limit the FCWs;

d) the remaining phase change is distributed on previous and later phase jumps, thereby ensuring that the ideal theta trajectory is maintained.

In a modification, the following changes are implemented:

(1) distribute the remaining phase jump on either earlier or later time instants instead of both earlier and later time instants, and distribute the additional phase jump as proportional to $1/r, 1/r^2$ and so forth. When r is small, a larger change in corresponding $\theta$ will not change EVM significantly.

(2) modifying r wherever FCW limiting algorithm is triggered, as for e.g., if the actual $\theta_{act}$ is the phase before FCW limiting, and $\theta_{app}$ is the phase after FCW limiting, then the amplitude r corresponding to $\theta_{act}$ can be modified to r $\cos(\theta_{act}-\theta_{app})$.

The method in the present approach is expediently configured for digitally modifying and limiting the FCW (Frequency Control Word) so that the FCW does not exceed known thresholds, e.g., chosen from $\pi/2$, $\pi/4$, $\pi/8$, and redistributing the FCWs while maintaining a cumulative sum of phases and without significant EVM degradation. The FCW threshold can be chosen arbitrarily and need not be in the form of $\pi/2^n$. The present method uses a FCW limiting algorithm which reduces supply voltage sensitivity of the DCO and enables significant reduction in area of capacitor bank which would otherwise be needed.

The invention also includes a computer readable medium encoded with data and instruction which when executed by a computing platform results in execution of a method as recited above.

BRIEF DESCRIPTION OF THE DRAWING

A more detailed understanding of the invention may be had from the following description of embodiments, given by way of example and to be understood in conjunction with the accompanying drawing wherein.

DETAILED DESCRIPTION AND FCW LIMITING ALGORITHM

A detailed description of one or more embodiments of the invention is provided below in the context of the accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention.

The present invention may be practiced according to the claims without some or all of these specific details. For the purpose of clarity, technical material that is known in the technical fields related to the invention has not been described in detail so that the present invention is not unnecessarily obscured.

Figure 1:
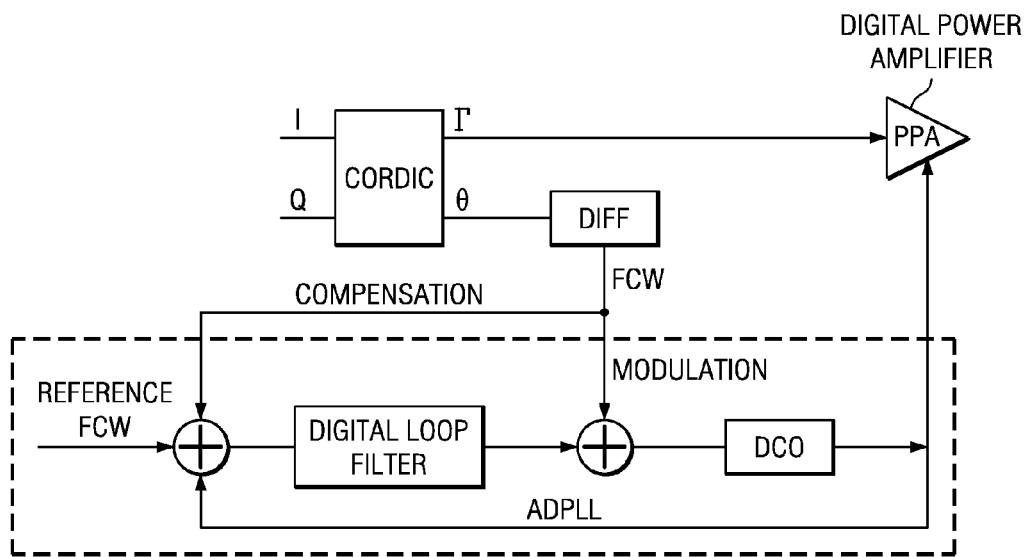
FIG. 1 illustrates a simplistic block diagram for transmitter in DRP design.
Figure 2:
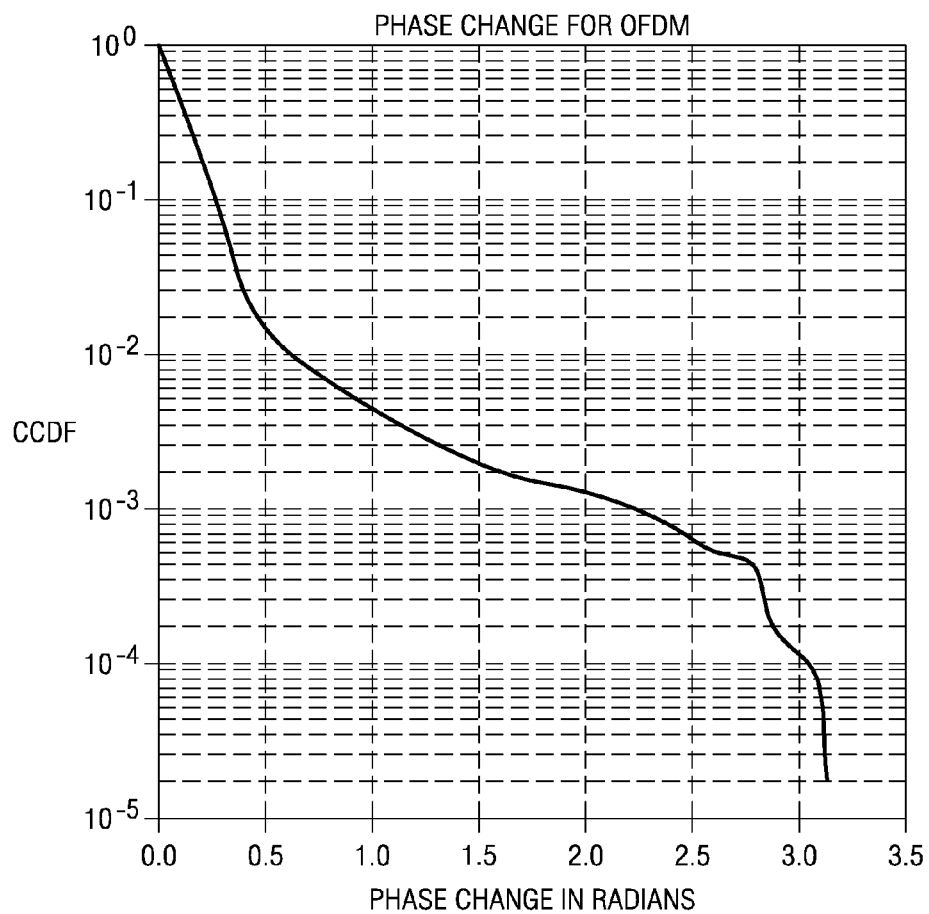
FIG. 2 illustrates an example of CCDF of phase change for an OFDM application.
Figure 3:
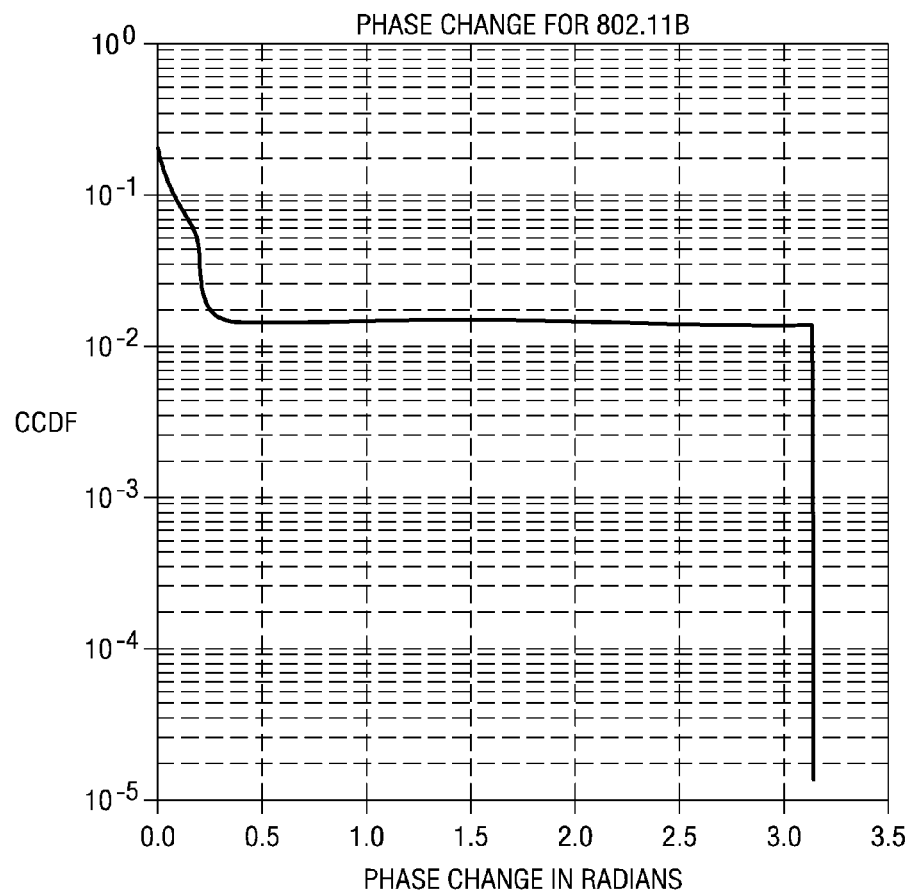
FIG. 3 illustrates an example of CCDF of phase change for 802.11b CCK 11 Mbps.
Figure 4:
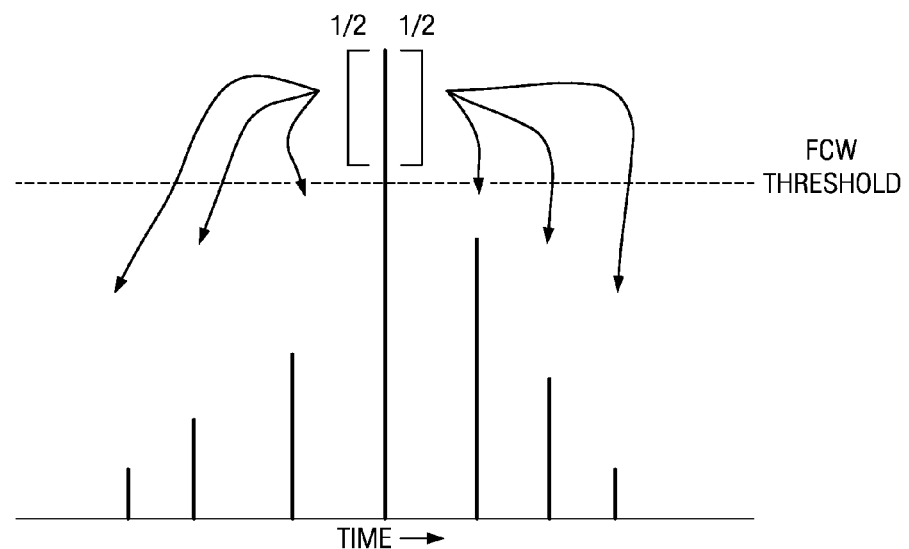
FIG. 4 shows exemplary FCWs before applying the algorithm.
Figure 5:
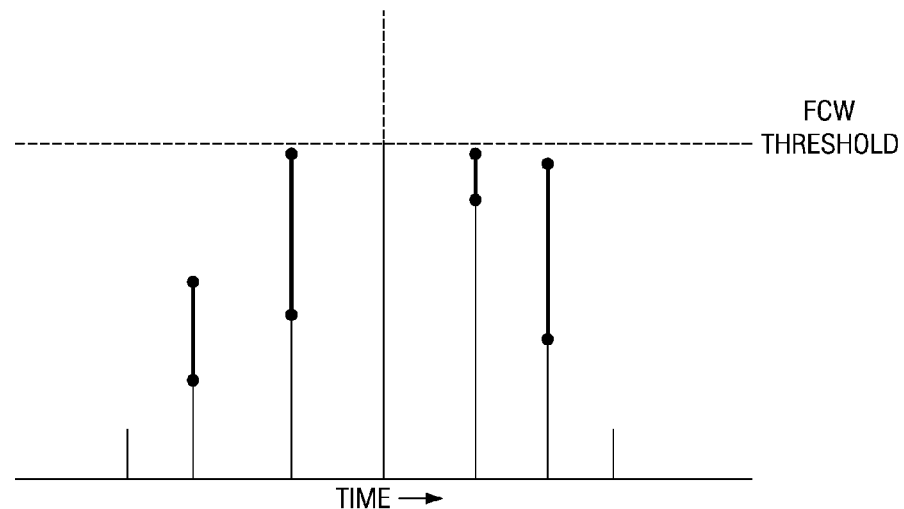
FIG. 5 shows exemplary FCWs after applying the algorithm.

The DCO model during modulation is that the phase trajectory is traversed as the cumulative sum of the frequency control words. Also a look at the signal trajectory shows that the large phase jumps of $\pm\pi$ radians occur near the origin where the amplitude(r) is very small. Therefore, a slight redistribution of FCWs instead of the actual FCWs near origin while maintaining their cumulative value to be the same, will not affect EVM considerably. Another point worth noting here is that these large phase changes are usually very rare. In FIG. 2 and FIG. 3, the probability of phase changes for WLAN OFDM and 802.11b signals is plotted. It can be seen that for both OFDM and IEEE 802.11b signals, the probability of phase changes greater than $\pi/4$ is only 1%. FIGS. 4 and 5 show examples of FCWs before applying the FCW algorithm and after applying the FCW limiting algorithm. FIGS. 4 and 5 show a way of splitting the extra phase jumps across various sample instants.

From the aforementioned discussion, it can be seen that since large phase are rare, the instantaneous phase change can be limited to a specified threshold FCWthresh. If the instantaneous phase change is greater than FCWthresh, one can adjust the remaining phase change over the former or latter FCWs while ensuring that the resultant FCWs are still less or equal to FCWthresh. (It is noted that herein, the expressions FCWthresh and FCWThresh are directed to the same variable.) This redistribution of FCWs causes the resulting phase trajectory to deviate slightly from the ideal phase trajectory but because these deviations are rare there is not much degradation in the EVM. As we are limiting the instantaneous phase change (or FCW), this algorithm is termed as FCW limiting.

The steps in the FCW limiting algorithm on the FCW at time instant n, FCW(n), can be described as:

---

Step 1.  If FCW(n)<= FCWThresh, the new FCW is same as FCW(n). Otherwise go to Step 2.
Step 2.  If FCW(n) > FCWThresh, then let the remaining phase change be denoted by r(n) and is given by r(n) = FCW(n) – sign(FCW(n))FCWThresh, where
sign(x) = 1 for x > 0
       =–1 for x < 0.
Step 3.  If |r(n)/2 + FCW(n–1)|<= FCWThresh then add r(n)/2 to FCW(n–1). Otherwise, let FCW(n–1) = sign(r(n)/2 + FCW(n–1))*FCWThresh and r'(n) = FCW(n–1) + r(n)/2 – sign(FCW(n–1) + r(n)/2)FCWThresh and distribute r'(n) on FCWs at time instants n–2, n–3 and so on and go to step 4.
Step 4.  If sign(r(n))*sign(FCW(n+1))=1 and |FCW(n+1)| >FCWThresh, then new FCW(n+1) is same as FCW(n+1). Else, if |r(n)/2 + FCW(n+1)| <= FCWThresh, then add r(n)/2 to FCW(n+1). Else, let FCW(n+1) = sign(r(n)/2 + FCW(n+1))*FCWThresh and r'(n) = FCW(n+1) + r(n)/2 – sign(FCW(n+1) + r(n)/2)FCWThresh and distribute r'(n) on FCWs at time instants n+2, n+3 and so on.

---

The results of the algorithm described above are also illustrated pictorially in FIG. 4 and FIG. 5. Error! Reference source not found.which show the FCWs before and after applying the FCW limiting algorithm respectively.

The above procedure can be repeated for all time instants. The algorithm has a very low complexity implementation in digital logic. Also, the algorithm introduces a delay in processing as at any instant the FCW might have to be distributed over N former or latter FCWs. For example, for WLAN OFDM if CORDIC rate is 300 MHz and modulation range is 75 MHz then FCWThresh=$\pi/4$. In this case, N=3 is sufficient to distribute the phase jumps, i.e., at any time instant n, FCW(N) can be distributed over FCWs over time instants n−3 to n+3. Therefore, the algorithm can be implemented as a FIFO (First In First Out) with the length of the delay line being 2N+1.

The foregoing FCW limiting algorithm limits the maximum instantaneous frequency and hence the modulation range of DCO. If FCWThresh=$\pi/4$, the modulation range comes down by a factor of 4. This results in significant reduction in the capacitor bank area and hence reduction in the parasitic capacitance. It also significantly reduces the supply voltage sensitivity of the DCO. Another advantage of the present FCW limiting algorithm is its simplicity and that it is implemented fully in digital domain. This also enables one to choose an arbitrary FCWThresh and not necessarily of the form $\pi/2^n$.

The invention includes certain methods which can be treated as extensions of the FCW limiting algorithm. It is noted that in the above description, the discussion is directed to the method of modifying the FCWs so as to limit it to FCWThresh. Such method can also be extended by modifying the r whenever the $\theta$ changes. It should be noted that the $\theta$ trajectory is changing because the FCWs are changing as a result of the FCW limiting algorithm and the $\theta$ trajectory is the accumulation of the FCWs. The method of changing r is described next.

Let $\theta_{act}$ be the actual phase before FCW limiting, and $\theta_{app}$ be the phase after FCW limiting is applied. The amplitude r(n) corresponding to $\theta_{act}$ can be modified to r'(n)=r(n) cos($\theta_{act}-\theta_{app}$). The purpose of modifying or changing r(n) is to choose a new point on the new theta curve that is closest to the original r(n).

Figure 7:
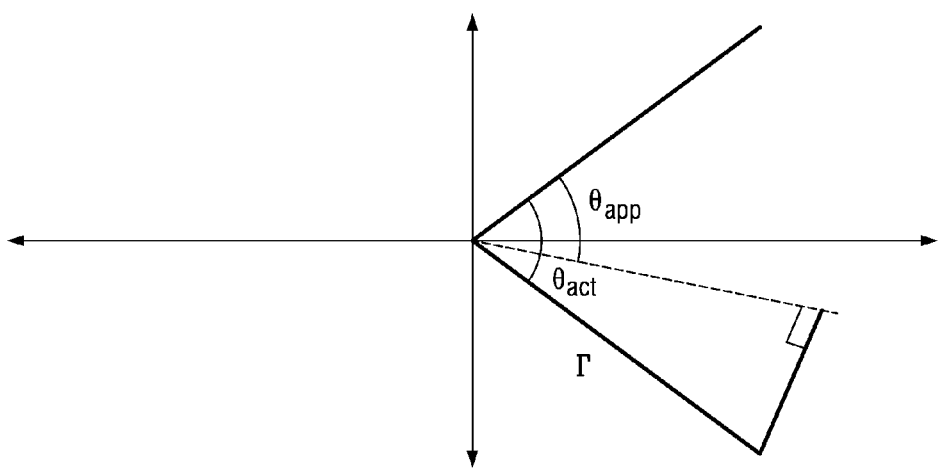
FIG. 7 shows the basis for an embodiment where the value of r changes with varying phase.

It is seen from FIG. 7 that when a change of $\theta_{app}$ is applied on the theta trajectory, then the amplitude is chosen along the dotted line instead of the original solid line which corresponds to the case of $\theta_{act}$ change in theta. Thus the new amplitude r'(n), on the dotted line should be chosen such that it is closest to the original point r(n) which is given by the perpendicular from the r(n) to the dotted line. Thus the distance of r'(n) from origin is r(n) cos($\theta_{act}-\theta_{app}$).

Figure 6:
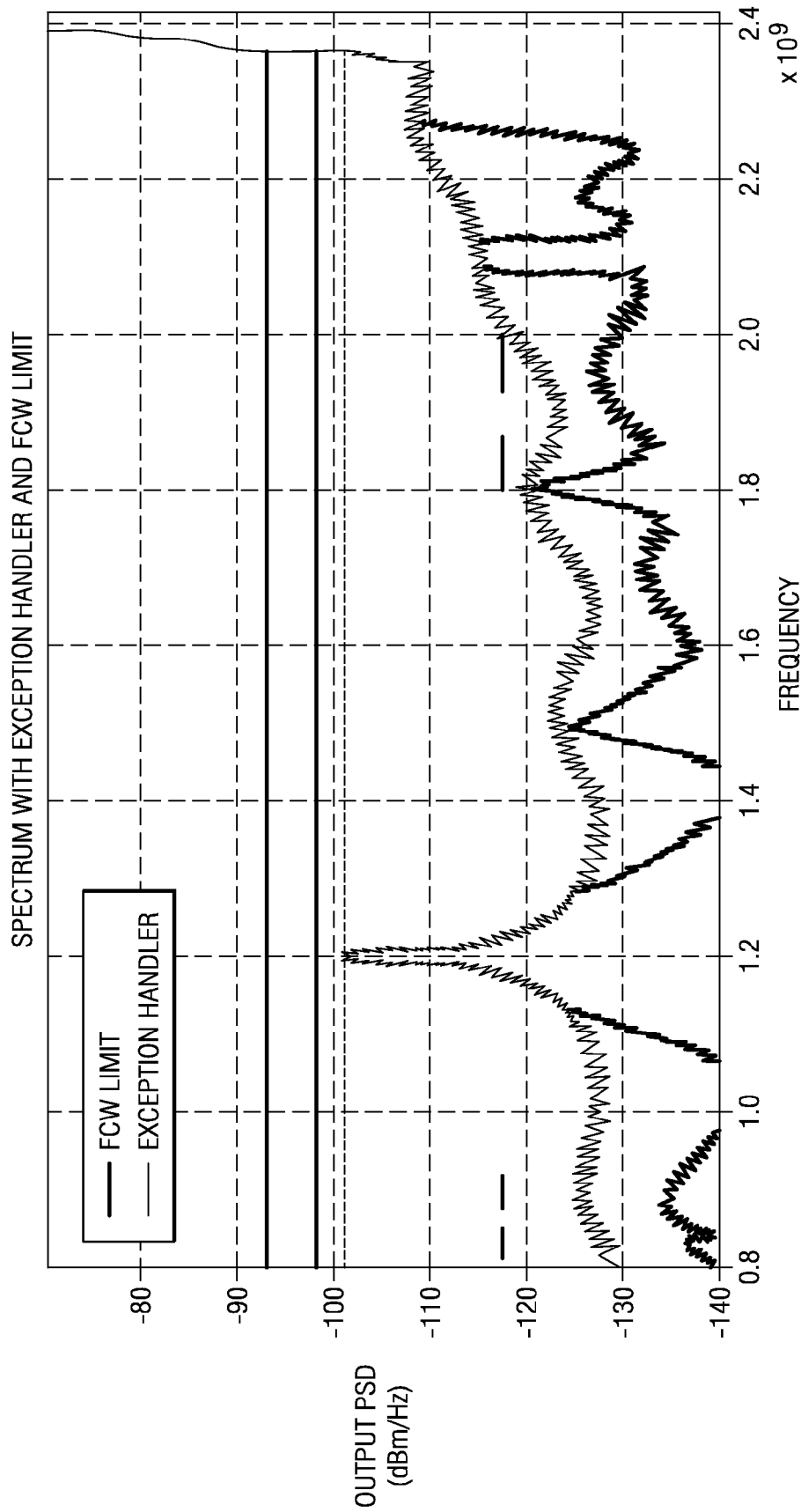
FIG. 6 shows an exemplary plot of the output PSD vs. frequency for both FCW limiting and prior art.

Simulation results: The error vector magnitude (EVM) which measures the signal fidelity in the in-band is very similar for both prior art and FCW limiting algorithm. However, in comparison with the prior art, it is noted that FCW limiting has lower out of band emissions. FIG. 6 shows an exemplary plot of the output PSD vs. frequency for both FCW limiting and prior art. It is noted that the emission with the present approach where FCW is limited is 10 dB lower than that of the prior art method of exception handling.

Tables 1 and 2 below show different exemplary values of EVM for changing Cordic rate values, for IEEE 802.11a/g and IEEE 802.11b applications where FCW is limited using the present algorithm.

TABLE 1

EVM with FCW limiting for FDM(11a/g).

| CORDIC rate | EVM (db) for diff modulation ranges | | | |
|---|---|---|---|---|
| | 75 MHz | 150 MHz | 300 MHz | 600 MHz |
| 150 MHz | −42 | −44.5 | — | — |
| 300 MHz | −50 | −54.8 | −56 | — |
| 600 MHz | −51 | −58 | −59 | −59.6 |

TABLE 2

EVM with FCW limiting for 802.11b.

| CORDIC rate | EVM(db) for diff modulation ranges | | | |
|---|---|---|---|---|
| | 75 MHz | 150 MHz | 300 MHz | 600 MHz |
| 300 MHz | −32.4 | −32.6 | — | |

The foregoing FCW Limiting algorithm includes the following advantages:
1. FCW limiting algorithm results in significant reduction in area of capacitor bank.
2. FCW limiting algorithm significantly reduces the supply voltage sensitivity of DCO.
3. The algorithm effectively decouples the CORDIC rate and DCO tuning range making them independent parameters in the overall design.
4. Low complexity as it is implemented completely in digital domain.
5. As it is only digital logic, an arbitrary FCW threshold can be chosen which is not necessarily in the form of $\pi/2^n$.
6. Enables trade-off between EVM and out of band noise energy.

The present invention includes a computer readable medium encoded with software data/instruction which when executed by a computing platform would result in execution of a method as described and claimed herein. Different embodiments of the present subject matter can be implemented in software which can be used in any suitable computing environment. The embodiments of the present subject matter are also operable in a number of general-purpose or special-purpose computing environments, or processors or processing units. Some computing environments include personal computers, general-purpose computers, server computers, hand-held devices (including, but not limited to, telephones and personal digital assistants (PDAs) of all types), laptop devices, multi-processors, microprocessors, set-top boxes, programmable consumer electronics, network computers, minicomputers, mainframe computers, distributed computing environments and the like to execute code stored on a computer-readable medium or computer memory elements. The embodiments of the present subject matter may be implemented in part or in whole as machine-executable instructions, such as program modules that are executed by a computer. Generally, program modules include routines, programs, objects, components, data structures, and the like to perform particular tasks or to implement particular abstract data types. In a distributed computing environment, program modules may be located in local or remote storage devices.

Computer memory elements can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks™, and the like; and other types of data storage.

"Processor" or "processing unit," as referred to hereinabove, includes any type of computational circuit, such as, but not limited to, a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor, or any other type of processor or processing circuit. The term also includes embedded controllers, such as generic or programmable logic devices or arrays, application specific integrated circuits, single-chip computers, smart cards, and the like.

In the foregoing detailed description of embodiments of the invention, various features are grouped together in a single exemplary embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should therefore be determined with reference to the appended claims, along with the full scope of equivalents to which such claims are entitled. In the appended claims, the terms "including" and "in which" where present, are used as the plain-English equivalents of the respective terms "comprising" and "wherein," respectively. Moreover, the terms "first," "second," and "third," etc., are used merely as labels, and are not intended to impose numerical requirements on their objects.

The invention claimed is:

1. A method, comprising:
   using a CORDIC (COordinate Rotation Digital Computer) block in a DRP (digital radio processor) to convert IQ signal samples from baseband to r (amplitude) and θ (phase) samples, said DRP including a DCO (Digitally Controlled Oscillator) wherein phase difference between consecutive samples is termed as FCW (Frequency Control Word);
   digitally modifying and limiting FCW so that no FCW value exceeds a predetermined FCW threshold; and
   limiting a modulation range of said DRP by a factor of 4 when a threshold of said FCW (FCW$_{thresh}$)=π/4.

2. A method as in claim 1, including the step of modifying a FCW profile from the CORDIC block to assist in limiting the FCW.

3. A method as in claim 1 including the step of limiting an instantaneous FCW to a specified threshold, FCW$_{thresh}$.

4. A method as in claim 1 including the step of using an algorithm for limiting CORDIC rate in the form of maximum instantaneous frequency and hence limiting a modulation range of the DCO.

5. A method as in claim 4 including the step of implementing said algorithm as a FIFO (first In First Out) with a length of delay line being 2N+1 where at any instant, the FCW is distributed over N former or latter FCWs.

6. A method as in claim 1 including the step of choosing an arbitrary FCW threshold (FCW$_{thresh}$).

7. A method as in claim 6 including the step wherein, if an instantaneous phase change is greater than $_{FCWthresh}$, then adjusting remaining phase changes over former or latter FCWs.

8. A method as in claim 7 including the step of ensuring that resultant FCWs are still less than or equal to FCW$_{thresh}$.

9. A method, comprising:
   digitally modifying and limiting a FCW (Frequency Control Word) in a Digitally Controlled Oscillator (DCO) deployed as part of a DRP (Digital Radio Processor) tuned to a tuning frequency range and having operating channel center frequencies, so that the FCW does not exceed known thresholds chosen from π/2, π/4, π/8, and redistributing the FCWs while maintaining a cumulative sum of phases.

10. A method as in claim 9 which uses a CORDIC block that converts IQ signal samples from baseband to r and θ samples, including the step of modifying a FCW profile from the CORDIC block to assist in limiting the FCW.

11. A method as in claim 9 including the step of limiting an instantaneous FCW to a specified threshold, FCW$_{thresh}$.

12. A method as in claim 9 including the step of using an algorithm for limiting CORDIC rate in the form of maximum instantaneous frequency and hence limiting a modulation range of the DCO.

13. A method as in claim 12 including the step of implementing said algorithm as a FIFO (first In First Out) with a length of delay line being 2N+1 where at any instant, the FCW is distributed over N former or latter FCWs.

14. A method as in claim 9 including the step of choosing an arbitrary FCW threshold (FCW$_{thresh}$).

15. A method as in claim 14 including the step wherein, if an instantaneous phase change is greater than FCW$_{thresh}$, then adjusting remaining phase changes over former or latter FCWs.

16. A method as in claim 15 including the step of ensuring that resultant FCWs are still less than or equal to FCW$_{thresh}$.

17. A method as in claim 14 wherein if FCW$_{thresh}$=π/4, then limiting modulation range by a factor of 4.

18. A method for use in a DRP (Digital Radio Processor) which uses a CORDIC (COordinate Rotation Digital Computer) block that converts IQ signal samples from baseband to r (amplitude) and θ (phase) samples, and which includes a DCO (Digitally Controlled Oscillator) wherein phase difference between consecutive samples is FCW (Frequency Control Word), said method comprising:
   ascertaining a phase jump from an earlier to a later instant and distributing said phase jump selectively among earlier and later time instants, said distributing being proportional to $1/r, 1/r^2$ and; and
   modifying amplitude r when FCW limiting algorithm is triggered such that if θ$_{act}$ is actual phase before FCW limiting, and θ$_{app}$ is phase after FCW limiting, such that the amplitude r corresponding to θ$_{act}$ is modified to r cos (θ$_{act}$−θ$_{app}$).

19. The method of claim 18, wherein limiting FCW comprises controlling the FCW not to exceed a predetermined FCW threshold FCW$_{thresh}$.

20. The method of claim 18 further comprising:
   using an algorithm for limiting a CORDIC rate in the form of maximum instantaneous frequency thereby limiting a modulation range of the DCO.

21. The method as in claim 20 further comprising:
   implementing said algorithm as a FIFO (first in first out) with a length of delay line being 2N+1 where at any instant, the FCW is distributed over N former or latter FCW.

22. A DRP (Digital Radio Processor) comprising:
   a CORDIC (COordinate Rotation Digital Computer) block that converts IQ signal samples from baseband to r (amplitude) and θ (phase) samples; and
   a DCO (Digitally Controlled Oscillator), wherein phase difference between consecutive samples is FCW (Frequency Control Word), the DCO being capable of ascertaining a phase jump from an earlier to a later instant and distributing said phase jump selectively among earlier and later time instants, said distributing being proportional to $1/r, 1/r^2$ and; and being capable of modifying amplitude r when FCW limiting algorithm is triggered such that if $\theta_{act}$ is actual phase before FCW limiting, and $\theta_{app}$ is phase after FCW limiting, such that the amplitude r corresponding to $\theta_{act}$ is modified to $r \cos(\theta_{act} - \theta_{app})$.

* * * * *